(12) United States Patent
Kim

(10) Patent No.: US 7,507,625 B2
(45) Date of Patent: Mar. 24, 2009

(54) FLASH MEMORY DEVICE AND METHOD FOR MANUFACTURING THE SAME

(75) Inventor: Yeong-Sil Kim, S'uwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 208 days.

(21) Appl. No.: 11/474,202

(22) Filed: Jun. 23, 2006

(65) Prior Publication Data

US 2006/0292798 A1      Dec. 28, 2006

(30) Foreign Application Priority Data

Jun. 27, 2005      (KR) .................... 10-2005-0055592

(51) Int. Cl.
*H01L 21/8247*      (2006.01)
(52) U.S. Cl. ................... 438/257; 257/E21.179
(58) Field of Classification Search ......... 438/257–267; 257/E21.179
See application file for complete search history.

(56) References Cited

U.S. PATENT DOCUMENTS 5,736,442 A * 4/1998 Mori ..................... 438/257
6,146,946 A * 11/2000 Wang et al. ............. 438/264

OTHER PUBLICATIONS

Office Action dated Sep. 19, 2008; "Flash Memory Device and Method for Manufacturing the Same"; Chinese Patent Application No. 200610090551.7; The State Intellectual Property Office of P.R. C., People's Republic of China.

* cited by examiner

*Primary Examiner*—Richard A. Booth
(74) *Attorney, Agent, or Firm*—Andrew D. Fortney

(57) ABSTRACT

A flash memory device, and a manufacturing method thereof, having advantages of protecting sidewalls of a floating gate and a control gate and preventing a recess of an active area of a source region are provided. The method includes forming a tunneling oxide layer on an active region of a semiconductor substrate, forming a floating gate, a gate insulation layer, and a control gate on the tunneling oxide layer, forming insulation sidewall spacers on sides of the floating gate and the control gate, and removing at least portions of the tunneling oxide layer and the device isolation layer so as to expose the active region.

11 Claims, 4 Drawing Sheets

FLASH MEMORY DEVICE AND METHOD FOR MANUFACTURING THE SAME

CROSS-REFERENCE TO RELATED APPLICATION

This application claims priority to and the benefit of Korean Patent Application No. 10-2005-0055592, filed in the Korean Intellectual Property Office on Jun. 27, 2005, the entire contents of which are incorporated herein by reference.

BACKGROUND OF THE INVENTION (a) Field of the Invention

The present invention relates to a semiconductor memory device. More particularly, the present invention relates to a flash memory device, and a manufacturing method thereof, that protects sidewalls of a floating gate and a control gate and prevents recess of an active area of a source region so as to improve the electrical characteristics and the reliability of the device.

(b) Description of the Related Art

Recently, a non-volatile memory device having a SONOS (polysilicon/oxide/nitride/oxide/semiconductor) structure has been widely noticed in that it can enhance some problems belonging to other non-volatile memory devices.

This is because the upper oxide layer, namely the top oxide, may act as a supplier of highly concentrated traps into the interface with the nitride layer as well as a potential barrier against charges that move through the gate.

Accordingly, even though the size of a memory window is maintained, the thickness of a gate insulation layer (e.g., a nitride layer) can be thinner. Therefore, a non-volatile memory device having high efficiency can be manufactured due to the lower programmable voltage for writing and erasing.

Flash memory devices that are commercially available may be divided into a stacked gate flash cell device that has a control gate and a floating gate, and a SONOS flash cell device that has a single gate and a stacked gate dielectric material (e.g., oxide/nitride/oxide (ONO) structure).

The stacked gate flash cell device is programmed and erased by using a shift of a turn-on threshold voltage of the control gate due to a local electric field that is induced by hot carriers implanted into the floating gate region by hot carrier injection.

Also the SONOS flash cell device is programmed by using hot carrier traps that are implanted from the interface between the oxide layer and the nitride layer of the ONO region or defect sites of the nitride layer as the role of the floating gate of the stacked gate flash cell device.

The programming and erasing is controlled by the shifted turn-on threshold voltage of the gate.

The major influencing issue on the working characteristics of such a flash memory device is how the hot carrier injection effect, which influences on the programming of the device, can be maximized.

Particularly, as low power consumption devices are widely developed, the device characteristics as above have become important.

Among manufacturing methods of NOR type flash memory devices, there may be a process step wherein the source region of two flash memory devices are connected. For this process, there may be a process step wherein the isolation material is removed from a shallow trench isolation (STI) structure between two flash memory devices, and a common source is formed by ion implantation into the area where the STI structure was removed.

Now, a method of manufacturing conventional flash memory devices will hereinafter be described in detail with reference to the accompanying drawings.

FIG. 1A to FIG. 1C are cross-sectional views showing principal stages of a conventional flash memory device.

The left figure of each drawing describes an active region and the right figure of each drawing describes an interface region between an active region and a device isolation region.

As shown in FIG. 1A, a device isolation layer 12 is formed on a device isolation region of semiconductor substrate 11 that is defined into an active region and a device isolation region.

Subsequently, a tunneling oxide layer 13 is formed on the active region of the semiconductor substrate 11, and then a floating gate 14, a gate insulation layer 15, and a control gate 16 are sequentially formed thereon.

The floating gate 14 and the control gate 16 are formed as described below.

Firstly, a first polysilicon layer for a floating gate is formed on the tunneling oxide layer 13 to a thickness of about 2500 Å.

Subsequently, the gate insulation layer 15 is formed on the first polysilicon layer. The gate insulation layer 15 may have an oxide layer/nitride layer/oxide layer (ONO) structure.

In order to form the gate insulation layer 15 having the ONO structure, a first oxide layer is formed by thermal oxidation of the first polysilicon layer, a silicon nitride layer may be formed on the first oxide layer by a thermal nitride-forming process, and a second oxide layer may be formed thereon by another thermal oxide-forming process.

Subsequently, a second polysilicon layer for a control gate is formed on the gate insulation layer 15 to a thickness of about 2500 Å. And then, the control gate 16 and the floating gate 14 are formed by selectively etching the second polysilicon layer, the gate insulation layer 15, and the first polysilicon layer by using a photo and etching process.

As shown in FIG. 1B, a photoresist pattern 17 is formed by coating a photoresist on the entire surface of the semiconductor substrate 11, including the floating gate 14 and the control gate 16, and patterning by an exposure and development process so as to define a source region.

Subsequently, the device isolation layer 12 is plasma-etched so that the source region is exposed using the patterned photoresist 17 as a mask. That is, in order to expose the source region, the device isolation layer 12 (and, to the extent it may be exposed, the tunneling oxide layer 13) are removed by the plasma etching process.

As shown in FIG. 1C, the photoresist 17 is removed. Although subsequent processes are not shown, a source/drain region is formed on an active region of the semiconductor substrate 11.

However, there are some drawbacks in the conventional manufacturing method of a flash memory device as described above.

That is, in that process, the floating gate and the control gate are used as an etch-stop layer. As a result, the tunneling oxide layer and the active region under the floating gate may be exposed to plasma damage. In addition, the active region A on the extended line of the floating gate is etched, so the edge may become sharp. If a voltage is applied to the active region A, an electric field may be concentrated so as to generate a leakage current, and so the reliability of the device may deteriorate.

The above information disclosed in this Background section is only for enhancement of understanding of the background of the invention and therefore it may contain information that does not form knowledge or other form of prior art that may be already known in this or any other country to a person of ordinary skill in the art.

SUMMARY OF THE INVENTION

The present invention has been made in an effort to provide a flash memory device and a manufacturing method thereof having advantages of protecting sidewalls of a floating gate and a control gate and preventing recess of an active area of a source region so as to improve the electrical characteristics.

An exemplary embodiment of the present invention provides a manufacturing method of a flash memory device including: forming a tunneling oxide layer in an active region of a semiconductor substrate further containing an isolation layer in a device isolation region; sequentially forming a floating gate, a gate insulation layer, and a control gate on the tunneling oxide layer; forming insulation sidewalls on sides of the floating gate and the control gate; forming a photoresist pattern over the semiconductor substrate; exposing a source region of the flash memory device by selectively removing the tunneling oxide layer and the device isolation layer, using the photoresist pattern as an etching mask; and implanting impurity ions into the source region.

Another embodiment of the present invention provides a flash memory device including: a semiconductor substrate having an active region and a device isolation region; an isolation layer in the device isolation region; a tunneling oxide layer, a floating gate, a gate insulation layer, and a control gate in the active region of the semiconductor substrate; an insulation sidewall spacer on sidewalls of the floating gate and the control gate; and a common source region in a predetermined portion of the active region and the device isolation region.

The insulation sidewall may comprise a single layer or a combination of layers, and may comprise an oxide layer and/or a silicon nitride layer.

The insulation sidewall may have a spacer shape and may be formed by depositing one or more insulation layers and anisotropically etching the insulation layer(s) (e.g., by performing an etch-back process). When the insulation sidewall spacer comprises a combination of layers, each of the oxide layer and the silicon nitride layer of the combination layer may have a thickness of 180-220 Å.

DETAILED DESCRIPTION OF THE EMBODIMENTS

Figure 1A:
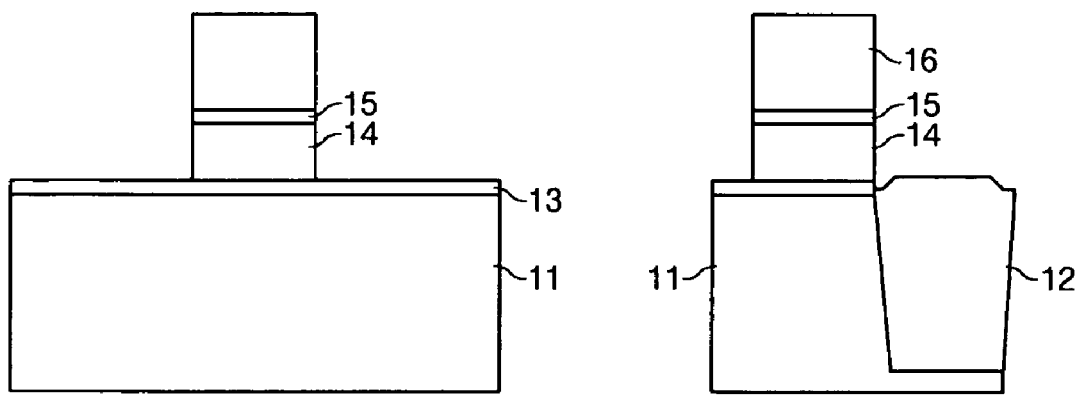
FIG. 1A to FIG. 1C are cross-sectional views showing principal stages of a conventional flash memory device.
Figure 1B:
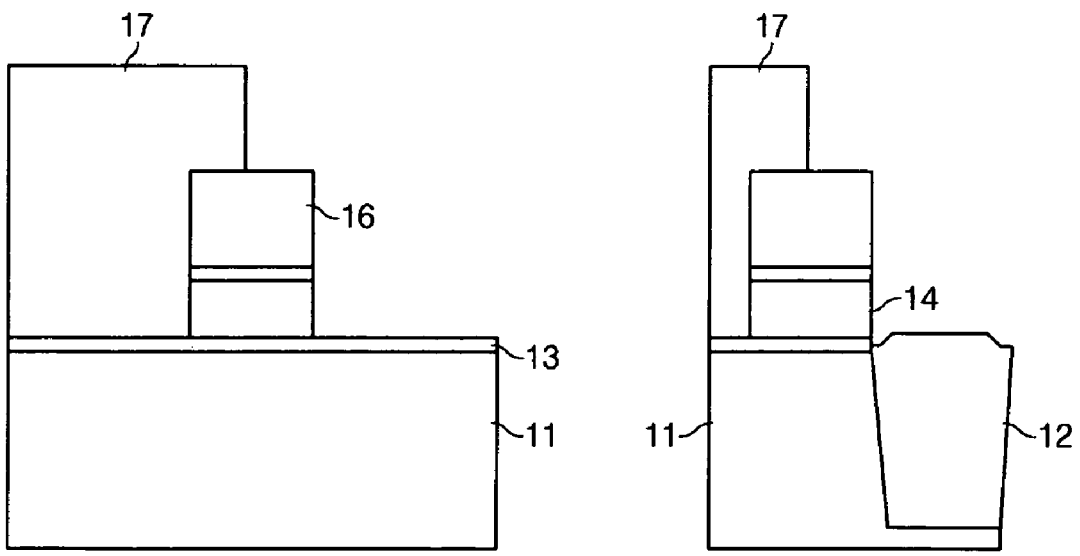
Figure 1C:
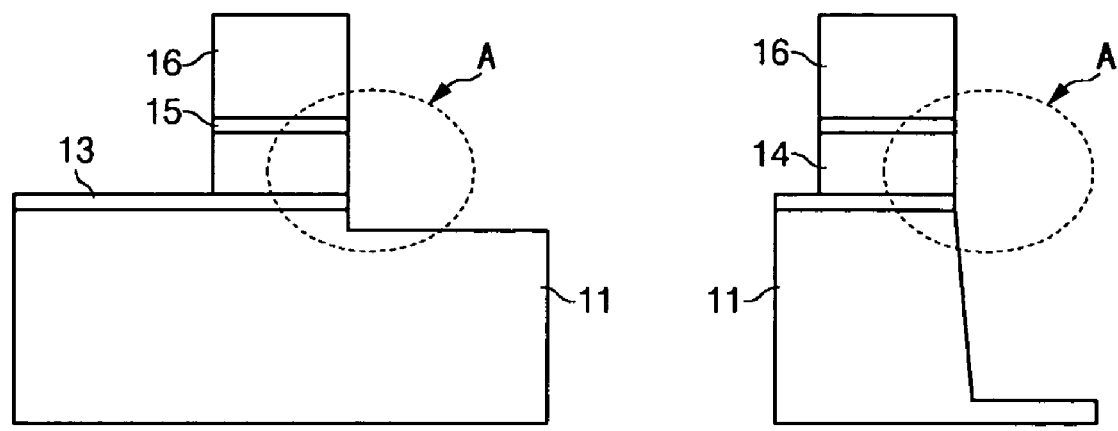

The present invention now will be described more fully hereinafter with reference to the accompanying drawings, in which preferred embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, a "region" of the substrate generally refers to an area of the substrate defined by a particular characteristic or function, and encompasses the corresponding vertical space below, at, and/or above the surface of the substrate.

An exemplary embodiment of the present invention will hereinafter be described in detail with reference to the accompanying drawings.

FIG. 2A to FIG. 2D are cross-sectional views showing principal stages of a flash memory device according to an exemplary embodiment of the present invention.

The left figure of each drawing describes an active region and the right figure of each drawing describes an interface region between an active region and a device isolation region.

Figure 2A:
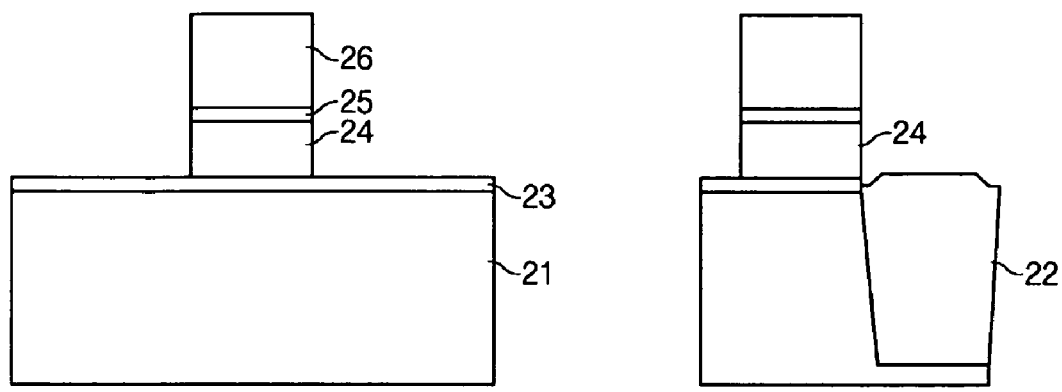
FIG. 2A to FIG. 2D are cross-sectional views showing principal stages of a flash memory device according to an exemplary embodiment of the present invention.

As shown in FIG. 2A, a device isolation layer 22 (e.g., an STI structure) is formed in a device isolation region of a semiconductor substrate 21 that contains an active region and a device isolation region. Naturally, the device isolation layer 22 can also comprise a LOCOS structure (formed by LOCal Oxidation of Silicon), or a combination of STI and LOCOS structures. In addition, the substrate may comprise a single crystal silicon wafer, which may further contain one or more layers of epitaxial silicon or silicon-germanium thereon.

Subsequently, a tunneling oxide layer 23 is formed on the active region of the semiconductor substrate 21, and then a floating gate 24, a gate insulation layer 25, and a control gate 26 are sequentially formed thereon. The floating gate 24 and the control gate 26 are formed as described below.

Firstly, a first polysilicon layer for the floating gate is formed on the tunneling oxide layer 23 to a thickness of about 2500 Å. Subsequently, a gate insulation layer 25 is formed on the first polysilicon layer. The gate insulation layer 25 may have an oxide layer/nitride layer/oxide layer (ONO) structure, or may simply consist essentially of an oxide layer (e.g., thermally grown silicon dioxide, or silicon dioxide formed by conventional deposition process, such as LP-CVD, HDP-CVD, thermal decomposition of TEOS, etc.). In order to form a gate insulation layer 25 having an ONO structure, a first oxide layer is formed by thermal oxidation of the first polysilicon layer, a silicon nitride layer is formed on the first oxide layer by a nitride-forming thermal process, and a second oxide layer is formed thereon by another thermal process for forming oxide. Subsequently, a second polysilicon layer for the control gate is formed on the gate insulation layer 25, also to a thickness of about 2500 Å. Then, the control gate 26 and floating gate 24 are formed by selectively etching the second polysilicon layer, the gate insulation layer 25, and the first polysilicon layer by using photolithography and etching processes. Alternatively, to improve coupling between the floating gate 24 and the control gate 26, the floating gate 24 may be patterned prior to forming the gate insulation layer 25, then the second polysilicon layer can be conformally deposited thereon and patterned separately to form a control gate 26 that overlaps sidewalls of the floating gate 24.

Figure 2B:
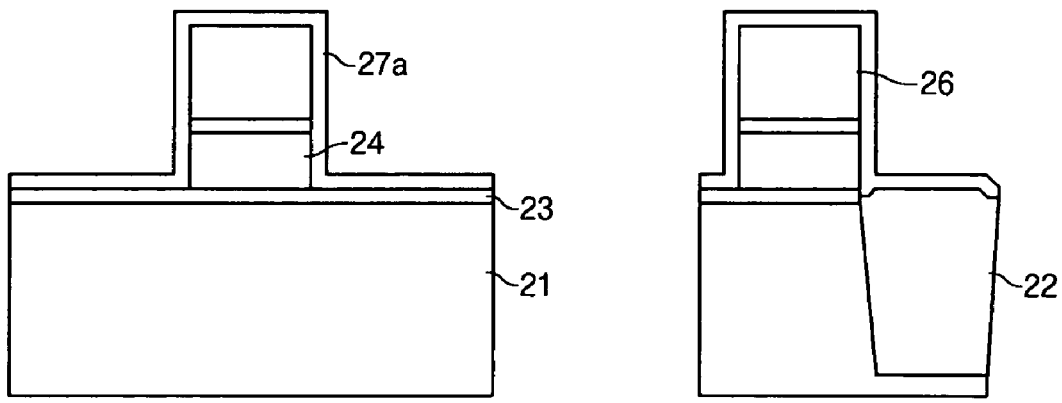

As shown in FIG. 2B, an insulation layer 27a for forming a spacer is formed on the entire surface of the semiconductor substrate 21 including the floating gate 24 and the control gate 26.

The insulation layer 27a sidewall may comprise a single layer or a combination of layers, including an oxide layer and/or a silicon nitride layer. A single insulation layer 27a (e.g., consisting essentially of silicon dioxide or silicon nitride) may have a thickness of 300-500 Å, preferably 350-450 Å. When the insulation layer 27a consists essentially of a bilayer, each of the oxide layer and the silicon nitride layer may have a thickness of 180-220 Å. At this time, the thickness of the oxide layer and the silicon nitride layer can be varied according to the characteristics of the device. The thickness presented above is a value determined after considering the spacing between cells and the process margins in a general flash memory device.

Figure 2C:
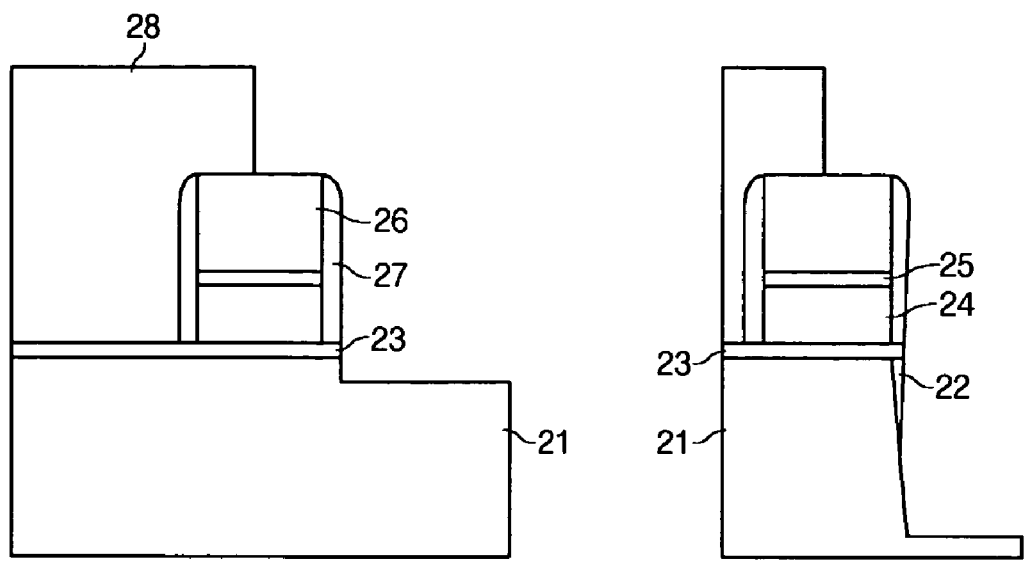

As shown in FIG. 2C, the insulation layer 27a is anisotropically etched (e.g., by an etch-back process) to form insulation sidewall spacers 27 on sides of the floating gate 24 and the control gate 26.

Subsequently, a photoresist 28 is coated on the semiconductor substrate 21, including the insulation sidewall spacers 27, and patterned to define a source/drain region (more particularly, a common source region) by an exposure and development process (e.g., photolithography).

Subsequently, the exposed tunneling oxide layer 23 and the underlying device isolation layer 22 are selectively plasma-etched so that the source region is exposed using the patterned photoresist 28 as a mask. That is, in order to expose the source region, the tunneling oxide layer 23 and the device isolation layer 22 adjacent to (but below) the floating gate 24 are removed by the plasma etching process.

During the plasma etching process, the insulation sidewall spacers 27 on the sides of the floating gate 24 and the control gate 26 suppress, inhibit or prevent a recess of the active region adjacent to and/or below the floating gate 24. Consequently, a portion of the device isolation layer 22 under the insulation sidewall spacer 27 can remain.

In addition, the tunneling oxide layer 23 can have a larger width than that of the floating gate 24 and the control gate 26, due to the existence of the insulation sidewall spacers 27.

Figure 2D:
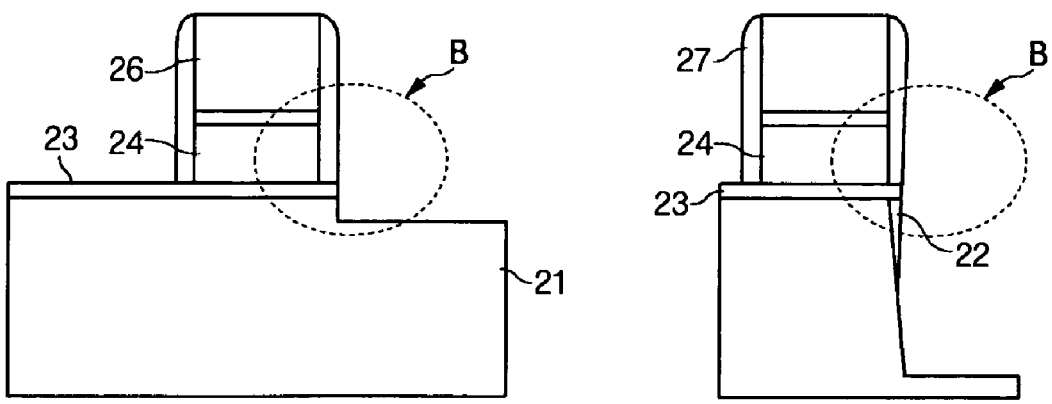

As shown in FIG. 2D, the photoresist 28 is removed. Although subsequent processes are not shown, source/drain regions, including a common source region at least partially in the area under the removed device isolation structure 22, are formed in active region(s) of the semiconductor substrate 21.

The flash memory device and the manufacturing method thereof may have the following effect.

The plasma etching process to expose an active region (e.g., for the common source) is performed after forming the insulation sidewall spacers on the sides of the floating gate and the control gate, and so any recess of the active region adjacent to the floating gate can be reduced, minimized, or prevented, and damage to the active area below of floating gate 24 and/or control gate 26 can be minimized. Therefore, the electrical characteristics and/or reliability of the device can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a flash memory device, comprising:
   forming a tunneling oxide layer in an active region of a semiconductor substrate further including a device isolation region having an isolation layer therein;
   forming a floating gate, a gate insulation layer, and a control gate on the tunneling oxide layer;
   forming insulation sidewall spacers on sides of the floating gate and the control gate, wherein a first insulation sidewall spacer is over the active region and a second insulation sidewall spacer is over the device isolation region in a cross-section of the floating gate, the gate insulation layer, the control gate, and the insulation sidewall spacers;
   forming a photoresist pattern over the first insulation sidewall spacer and part of the floating gate, the gate insulation layer, and the control gate exposing the second insulation sidewall spacer and the device isolation layer;
   exposing a source region by selectively removing portions of the device isolation layer using the photoresist pattern and the second insulation sidewall spacer as an etching mask, wherein a portion of the device isolation layer remains below the second insulation sidewall in the device isolation region; and
   implanting impurity ions into the source region.

2. The method of claim 1, wherein the insulation sidewall spacers comprise a single layer or a combination of layers.

3. The method of claim 2, wherein the insulation sidewall spacers comprise an oxide layer and a silicon nitride layer.

4. The method of claim 2, wherein forming the insulation sidewall spacers comprise sequentially forming an oxide layer and a silicon nitride layer on an entire surface of the semiconductor substrate, including the floating gate and the control gate and anisotropically etching the oxide layer and the silicon nitride layer.

5. The method of claim 3, wherein each of the oxide layer and the silicon nitride layer has a thickness of 180-220Å.

6. The method of claim 1, wherein forming the photoresist pattern comprises coating a photoresist on the semiconductor substrate, including the insulation sidewall spacers, and patterning the photoresist.

7. The method of claim 6, wherein the photoresist pattern is formed before portions of the tunneling oxide layer and the device isolation layer are removed.

8. The method of claim 6, wherein, the tunneling oxide layer and the device isolation layer are selectively removed by a plasma etching process using the patterned photoresist as an etching mask.

9. The method of claim 1, wherein implanting the impurity ions into the source region uses the photoresist pattern as a mask.

10. The method of claim 1, further comprising forming the isolation layer in the device isolation region of the semiconductor substrate.

11. The method of claim 1, wherein the tunneling oxide layer has a greater width than corresponding widths of the floating gate and the control gate.

* * * * *